US008440506B2

(12) United States Patent
Roberts et al.

(10) Patent No.: US 8,440,506 B2
(45) Date of Patent: May 14, 2013

(54) MICROELECTRONIC PACKAGE AND METHOD FOR A COMPRESSION-BASED MID-LEVEL INTERCONNECT

(75) Inventors: Brent M. Roberts, Phoenix, AZ (US); Mihir K. Roy, Chandler, AZ (US); Sriram Sriniyasan, Chandler, AZ (US); Sridhar Narasimhan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/546,549

(22) Filed: Jul. 11, 2012

(65) Prior Publication Data

US 2012/0279059 A1    Nov. 8, 2012

Related U.S. Application Data

(62) Division of application No. 12/646,854, filed on Dec. 23, 2009, now Pat. No. 8,278,752.

(51) Int. Cl.
*H01L 21/44* (2006.01)
*H01L 21/48* (2006.01)

(52) U.S. Cl.
USPC ..... 438/117; 438/107; 438/109; 257/E21.506

(58) Field of Classification Search .................. 438/117, 438/107, 109; 257/E21.506
See application file for complete search history.

(56) References Cited

U.S. PATENT DOCUMENTS

| 4,548,451 A | 10/1985 | Benarr et al. | |
|---|---|---|---|
| 4,687,265 A * | 8/1987 | Johnson et al. | 439/68 |
| 4,793,814 A | 12/1988 | Zifcak et al. | |
| 5,239,448 A | 8/1993 | Perkins et al. | |
| 5,371,654 A | 12/1994 | Beaman et al. | |
| 5,399,898 A | 3/1995 | Rostoker | |
| 5,485,039 A | 1/1996 | Fujita et al. | |
| 5,495,667 A * | 3/1996 | Farnworth et al. | 29/843 |
| 5,517,752 A * | 5/1996 | Sakata et al. | 29/832 |
| 6,190,181 B1 | 2/2001 | Affolter et al. | |
| 6,249,440 B1 | 6/2001 | Affolter | |
| 6,362,520 B2 * | 3/2002 | DiStefano | 257/696 |
| 6,664,628 B2 | 12/2003 | Khandros et al. | |
| 6,791,171 B2 | 9/2004 | Mok et al. | |
| 6,864,553 B2 | 3/2005 | Epitaux et al. | |

(Continued)

OTHER PUBLICATIONS

"Package Substrates/Interposers", http://www.SiliconFarEast.com/substrates.htm, (Nov. 6, 2009), 3 pages.

*Primary Examiner* — Nitin Parekh
(74) *Attorney, Agent, or Firm* — Blakely, Sokoloff, Taylor & Zafman LLP (57) ABSTRACT

A microelectronic package includes first substrate (120) having first surface area (125) and second substrate (130) having second surface area (135). The first substrate includes first set of interconnects (126) having first pitch (127) at first surface (121) and second set of interconnects (128) having second pitch (129) at second surface (222). The second substrate is coupled to the first substrate using the second set of interconnects and includes third set of interconnects (236) having third pitch (237) and internal electrically conductive layers (233, 234) connected to each other with microvia (240). The first pitch is smaller than the second pitch, the second pitch is smaller than the third pitch, and the first surface area is smaller than the second surface area.

20 Claims, 5 Drawing Sheets

U.S. PATENT DOCUMENTS

| | | |
|---|---|---|
| 7,002,430 B2 | 2/2006 | Benham et al. |
| 2002/0056922 A1* | 5/2002 | Funaya et al. ............... 257/778 |
| 2003/0001287 A1 | 1/2003 | Sathe |
| 2003/0013969 A1 | 1/2003 | Erikson et al. |
| 2007/0281391 A1* | 12/2007 | Ito et al. ....................... 438/109 |
| 2010/0032820 A1 | 2/2010 | Bruennert et al. |

* cited by examiner

MICROELECTRONIC PACKAGE AND METHOD FOR A COMPRESSION-BASED MID-LEVEL INTERCONNECT

CROSS REFERENCE TO RELATED APPLICATIONS

This application is a divisional of pending U.S. patent application Ser. No. 12/646,854 filed Dec. 23, 2009 entitled "MICROELECTRONIC PACKAGE AND METHOD FOR A COMPRESSION-BASED MID-LEVEL INTERCONNECT" and issued as U.S. Pat. No. 8,278,752 on Oct. 2, 2012.

FIELD

The disclosed embodiments of the invention relate generally to packaging for microelectronic devices.

BACKGROUND

Integrated circuit dies and other microelectronic devices are typically enclosed within a package that, among other functions, enables electrical connections between the die and a socket, a motherboard, or another next-level component. As die sizes shrink and interconnect densities increase, such electrical connections require scaling so as to match both the smaller pitches typically found at the die and the larger pitches typically found at the next-level component.

An existing approach to interconnect scaling within microelectronic packages is to use a single high density interconnect (HDI) substrate to handle the space transformation from die bump pitch, where a typical pitch value may be 150 micrometers (microns or μm) to system board level pitch, where a typical pitch value may be 1000 μm, i.e., 1.0 millimeter (mm). This approach results in very fine line, space, and via design rules to enable die routing and very large substrate body sizes in order to interface at the system board level pitch.

BRIEF DESCRIPTION OF THE DRAWINGS

The disclosed embodiments will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments presented. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of operations, the order of such operations as presented herein is not necessarily the only order in which such operations may be performed, and certain of the stated operations may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that includes a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION

In one embodiment, a microelectronic package includes a first substrate having a first surface area and a second substrate having a second surface area. The first substrate includes first level interconnects having a first pitch at a first surface thereof and a set of contact pads having a second pitch at a second surface thereof. The second substrate includes a first surface having a corresponding set of contact pads. The second substrate includes second level interconnects having a third pitch at a second surface thereof, and first and second internal electrically conductive layers that are connected to each other with a microvia. In one embodiment, the microelectronic package includes mid-level interconnects to provide a reusable surface mount attachment between the corresponding first and second contact pads of the first and second substrates. In one embodiment, the first pitch is smaller than the second pitch, the second pitch is smaller than the third pitch, and the first surface area is smaller than the second surface area.

Embodiments involve a combination of HDI substrate and HDI printed circuit board (PCB) technologies that results in a packaging solution useful for central processing unit (CPU) and chipset packaging and the like that is much more costeffective than the existing packaging solutions described above. To accomplish this, described embodiments break the space transformation into two levels, each with fundamentally different cost structures. The system level interface is handled by a first substrate manufactured using, for example, HDI PCB design rules and materials. The die level interface is handled by a second substrate, the size of which may be restricted to the minimum required to support an interconnect at the HDI PCB substrate level, manufactured using, for example, more restrictive die level design rules and materials. Because the cost of the die level design rules may exceed that of the PCB design rules by a factor of ten or more, embodiments yield a cost structure that is significantly less than that of existing techniques.

It was mentioned above that a proposed multiple-substrate architecture specifies one or more of the substrates to be thinner than a typical server substrate in order to stay within maximum height requirements and to provide a solution for high speed I/O signals. A key component for future generation products is plug and play microelectronic packages. Currently, the best inductor structures use thick-core substrates with large plated through holes (PTHs), but high speed I/O demands require thinner substrate cores with smaller PTHs. Cost pressure is also driving a trend toward thinner substrate cores.

In one embodiment, a method is described for connecting a patch and interposer through a double-compression interconnect that uses a load for activation of a mid-level interconnect (MLI) between the patch and the interposer. In one embodiment, a compression-based MLI offers a "plug and play" solution for original equipment manufacturers (OEM), or the like, who desire to offer multiple patch configurations of a simple/singular interposer design. In one embodiment, a compression-based MLI provides improved design flexibility at a reduced cost. Additionally, a compression-based interconnect decouples a patch and interposer and thus does not require an assembly process for engaging the MLI, nor does it require underfill to protect a ball grid array (BGA) interconnect. A compression-based mid-level interconnect (MLI) provides simplicity in the assembly process and flexibility for end customers to develop unique enabling solutions required to meet end customer needs.

Figure 1:
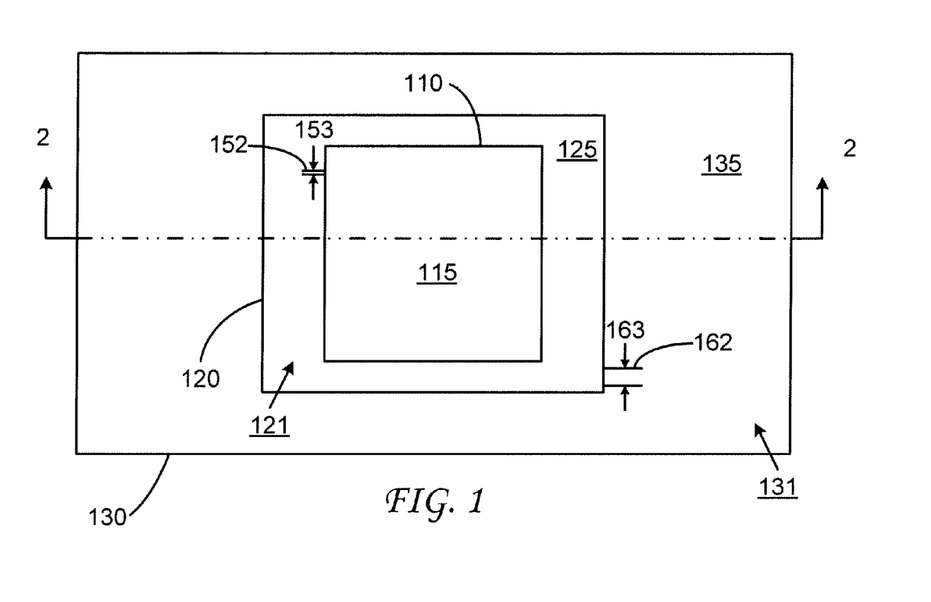
FIG. 1 is a plan view of a microelectronic package according to an embodiment of the invention.
Figure 2:
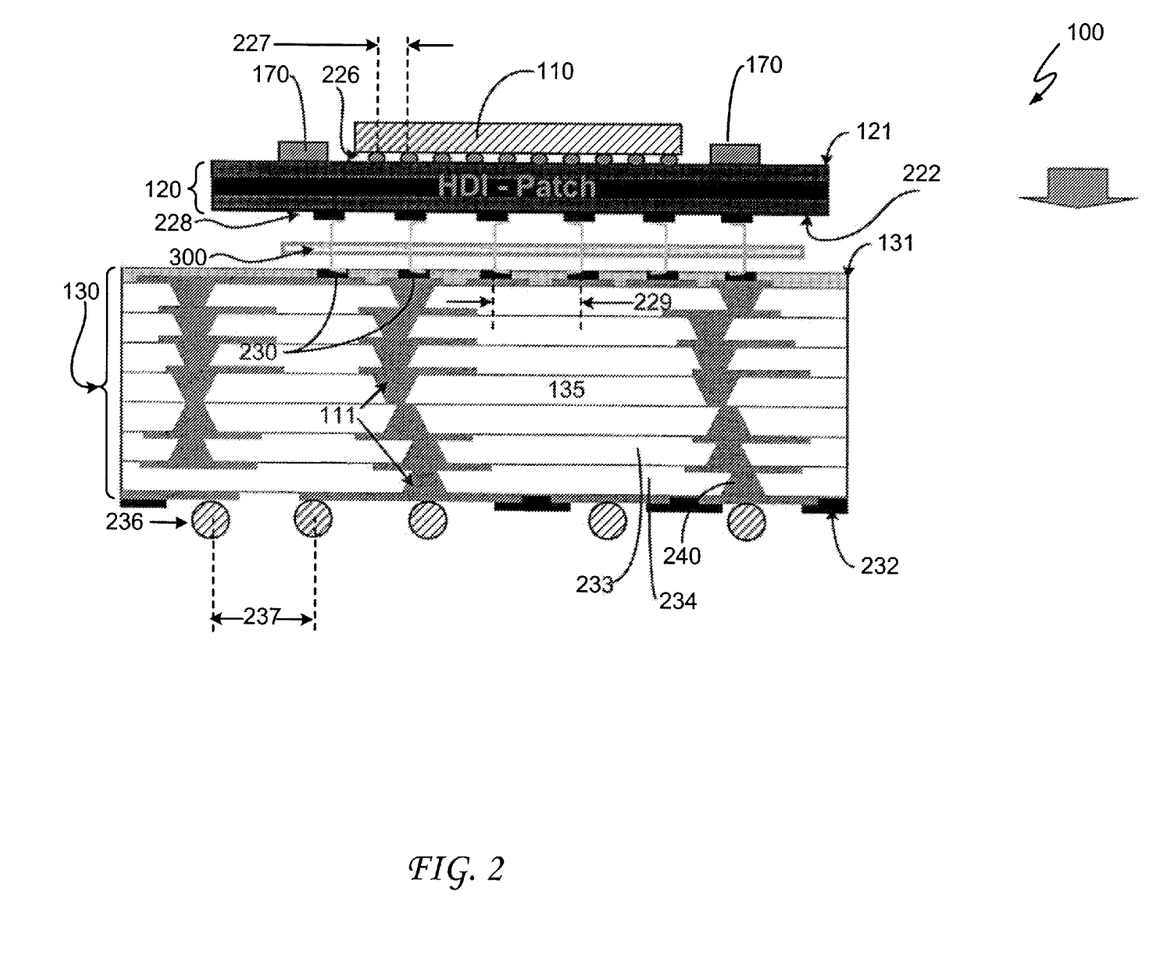
FIG. 2 is a cross-sectional view of the microelectronic package of FIG. 1 according to one embodiment.

Referring now to the drawings, FIG. 1 is a plan view and FIG. 2 is a cross-sectional view of microelectronic package 100 according to one embodiment. As illustrated in FIGS. 1 and 2, microelectronic package 100 includes microelectronic die 110, substrate 120, and substrate 130. Die 110 may include surface 111, with surface area 115 and an opposite surface for coupling contacts on a surface of the die to interconnects 226. Substrate 120 has surface 121 with surface area 125, surface 222, opposite surface 121, first level interconnects 226 having pitch 227 at surface 121, and a set of contact pads 228 having pitch 229 at surface 222. Substrate 130 has surface 131 with surface area 135, surface 232 opposite surface 131, second level interconnects 236 having a pitch 237, and internal layers 233 and 234 that may be connected to each other with microvia 240. Representatively, substrate 130 includes contact pads 230 at surface 131, having pitch 229 and corresponding to contact pads 228 of substrate 120.

Substrate 130 may include any suitable type of package substrate or other die carrier. In one embodiment, substrate 130 includes a multilayer substrate including a dielectric material. Each layer may include a number of conductors (e.g., traces), and these conductors may include any suitable conductive material, such as copper. Further, each metal layer may be separated from adjacent metal layers by one or more dielectric layers, and adjacent metal layers may be electrically interconnected by microvias or other conductive vias. The dielectric layers may comprise any suitable insulating material—e.g., polymers, including both thermoplastic and thermosetting resins or epoxies, ceramics, etc.—and the alternating layers of metal and dielectric material may be built-up over a core layer of a dielectric material (or perhaps a metallic core).

As an example, and as illustrated in FIG. 2, electrically conductive path 111 can include one or more microvias 240 that electrically connect adjacent internal layers (233, 234) of substrate 130. Such microvias 240 can be arranged one on top of another in a straight line or they can be staggered such that they only partially overlap. Another possible microvia arrangement is one in which the microvias do not overlap at all but rather are connected by electrically conductive traces that run between them. It should be noted that microvia 240, in accordance with traditional usage of that term, is a connection running only between two adjacent layers within substrate 130. This distinguishes it from a plated through hole, or PTH, which runs through an entire stack of substrate layers. As another example, electrically conductive path 111 can comprise a plated through hole or the like that extends throughout the entire extent of substrate 130. As an example, electrically conductive path 111 can comprise a plated through hole, a structure of stacked vias, or the like that extends through a core 135 of substrate 130. Electrically conductive path 111 may then further comprise a metal trace or the like that passes through build-up or similar layers that surround core 135.

As noted, a representative structure of microelectronic device 100 includes, as viewed, substrate 120 that is located above substrate 130 and has die 110 located above substrate 120. Microelectronic device 100 may further comprise die-side capacitors 170 and/or additional components, which, for example, could be resistors, inductors, active devices, stiffeners, or the like. In one embodiment, substrate 120 has a substrate core having a thickness that is no greater than 400 μm. Alternatively, substrate 120 may be made up entirely of such build-up or similar layers and may not have a core, in which case substrate 120 may representatively have a total thickness in a range of approximately 200-500 μm.

Representatively, pitch 227 of contacts on substrate 120 is smaller than pitch 229 of contacts on substrate 130, pitch 229 is smaller than pitch 237, and surface area 125 is smaller than surface area 135. Representatively, substrate 120 has fine line, space, and via design rules that allow connection to die 110 at controlled collapse chip connect (C4) pitches. Substrate 120 redistributes the input/output (IO), power, and ground bumps coming from die 110 to a larger pitch coarse enough to be mounted on substrate 130 such as an HDI PCB. As has been described, substrate 130, in addition to interfacing at a particular pitch with substrate 120 on one side, interfaces at a larger pitch with a socket or motherboard or the like on the other side. In one embodiment, a combination of substrates 120 and 130, which combination may be referred to as a substrate assembly, may serve as the "substrate" in a CPU or chipset package.

Die 110 is coupled to substrate 120 using interconnects 226, and substrate 130 is electronically connected to substrate 120 using compression-based interconnects 300. Interconnects 236 may connect microelectronic package 100 with a motherboard or the like (not shown) via a socket or similar component (also not shown). The socket connections that describe interconnects 236 may be of any suitable type, including pin grid array (PGA), land grid array (LGA), ball grid array (BGA).

Interconnects 226, being the interconnects that form the first level of connections coming out of die 110, are traditionally referred to as first level interconnects (FLI). Similarly, interconnects 236, being the interconnects that attach the die package to a motherboard or similar component, are traditionally referred to as second level interconnects (SLI). Interconnects 300 represent an interconnect level that forms connections to a component (substrate 120) that is not part of existing microelectronic packages. Following the naming scheme already in place for first level and second level interconnects, the phrase "mid level interconnect" ("MLI") is proposed herein as the name for interconnects 300.

As described below in FIGS. 3 and 4, a compression-based MLI 300 is, for example, a reusable interconnect which relies on compression to actuate the MLI 300 to activate corresponding surfaces of contact pads located on corresponding surfaces of first and second substrates, such as an interposer and HDI substrate patch. In one embodiment, surfaces of the contact pads are activated based on an interaction between a pin head (320-1/320-2) (included in the MLI interconnects), such that the pin head, when actuated, slides across a surface of a contact pad to make a micro-connection therebetween. In one embodiment, the MLI 300 includes a plurality of contact pins 320 that include opposed ends (320-1/320-2). The contact pins 320 may be gold plated, and when caused to slide across a contact pad surface, cause an activation of the surface to make a micro-connection between the pin head and the contact pad surface.

In one embodiment, the additional opposed ends 320-2 of the MLI 300 may be actuated to activate a surface of the corresponding contact pads of, for example, HDI substrate patch 120. As a result, in one embodiment, the MLI provides an interface between HDI substrate patch 120 and interposer 130. MLI 300 may provide a reusable surface mount attachment that requires a mechanical load to activate the MLI interconnections 320. Once the load is removed, MLI interconnections (320-1/320-2) disengage and allow for plug and play replacement of various substrate patches for patch upgrades, next generation processors, or other like chipsets, without having to replace interposer 130 which is fabricated onto a motherboard using conventional techniques.

A challenge facing manufacturers of microelectronic devices is developing processes capable of delivering high yielding assembly processes at fine bump pitches for large die. In the next generation assembly process, a thin-flexible substrate rather than a thick, rigid substrate can be assembled with a die. Thus, in one embodiment, substrate 120 is a high density interconnect (HDI) substrate patch. In one embodiment, HDI patch 120 may be a thin core patch that includes a stiffener. Referring again to FIG. 2, in one embodiment, substrate 130 may be a structure of stacked vias. Representatively, individual layers (e.g., 233, 234) may be individually manufactured in different configurations. Once the various individual layers are manufactured, the various layers may be pushed together as part of a lamination process with the filled vias 240 providing electrically conductive paths through the interposer. In one embodiment, interposer 130 may provide a step translation for HDI patch portion 120 that will include a CPU die or other chipset logic. In one embodiment, HDI patch is, for example, a 37 mm high density interconnect substrate.

As shown in FIG. 2, in one embodiment, first level interconnect 226 may have, for example, 130 micron pitch 227, with HDI substrate patch 120 having contact pads 228 with pitch 229 within, for example, the 500 micron range, and interposer 130 providing a step translation to a, for example, 1.0 mm pitch of a standard motherboard. In one embodiment, the reduce sized HDI patch 120 enables a lower cost design as compared to conventional HDI patches. Moreover, the multi-generation stepping provided by MLI interconnect 300 may enable several generations of use of interposer 130, without requiring a redesign of interposer 130 and merely replacing the patch and die ("die assembly") with the next generation PC or chipset circuits.

Figure 3:
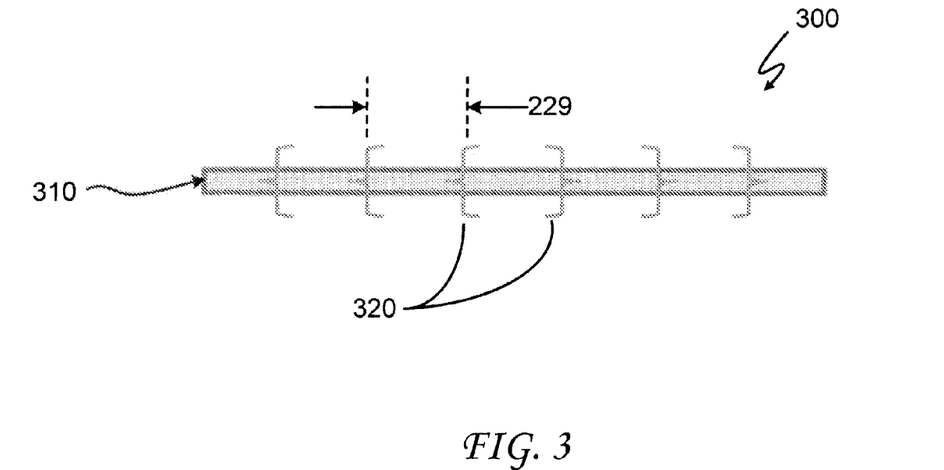
FIG. 3 is a plain view of a compression-based mid-level interconnect (MLI) according to one embodiment.

FIG. 3 further illustrates compression-based MLI interconnect 300. Representatively, MLI 300 may include body 310 as well as a plurality of interconnects 320. In one embodiment, interconnects 320 may be compression-based pins which are sewn into body 310. Compression-based pins 320 may be comprised of gold, may be nickel based and gold coated, copper-based, such as beryllium copper or other like copper alloy that may be gold-coated, or other like conductive material. As shown in FIG. 3, body 310 may be comprised of a low cost material such as plastic. Representatively, MLI 300 may include a load housing mechanism as well as guide posts to enable a connection to interposer 130 as well as HDI patch 120. In one embodiment, the load mechanism will place a load on first opposing contact pins 320-1 to enable surface activation between the pin heads and, for example, contact pads 230 of interposer 130.

Accordingly, as shown in FIG. 2, the application of a load to compress and actuate the compression-based pins of MLI 300 causes a surface activation between the pin heads and corresponding contact pads (228/230) to provide a micro-connection therebetween. This micro-connection enables MLI 300 to provide an interface between HDI patch 120 and interposer 130. As subsequent next generation dies including CPUs and chipset logic advance, the load mechanism of MLI 300 may be deactivated to disconnect HDI patch from MLI 300 and replace the HDI patch and die ("die assembly") with a next generation CPU or chipset logic. In one embodiment, the micro-connection between the pin heads and contact pads is achieved by providing gold plated contact pins and gold coated contact pads.

Figure 4:
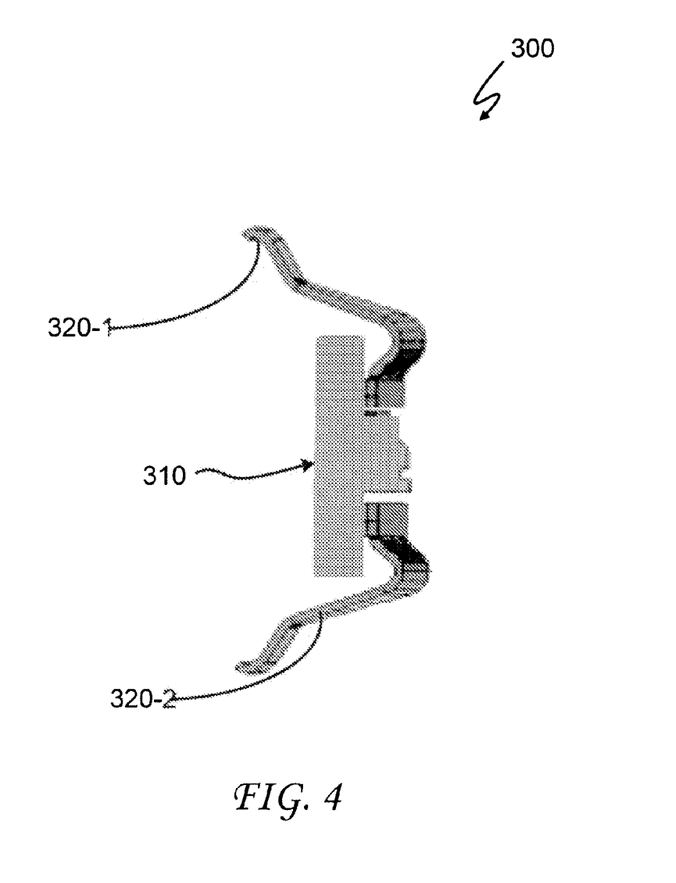
FIG. 4 is a cross-sectional view of the compression-based MLI of FIG. 3 according to one embodiment.

FIG. 4 shows a cross sectional view of MLI 300 which illustrates flange-shaped pins 320 which are stitched into body 310. In one embodiment, the body is a thermal form, mold formed, or other reduced cost item that may enable a stitch-in or other like connection of the pins. The pins may be gold plated pins, which may be a nickel based or stainless steel based pins that are gold coated. The gold may provide a malleable interface that interacts with the gold or copper pads to allow a micro-connection therebetween. In one embodiment, the pads may be 400 micron pads at a 500 micron pitch.

Figure 5:
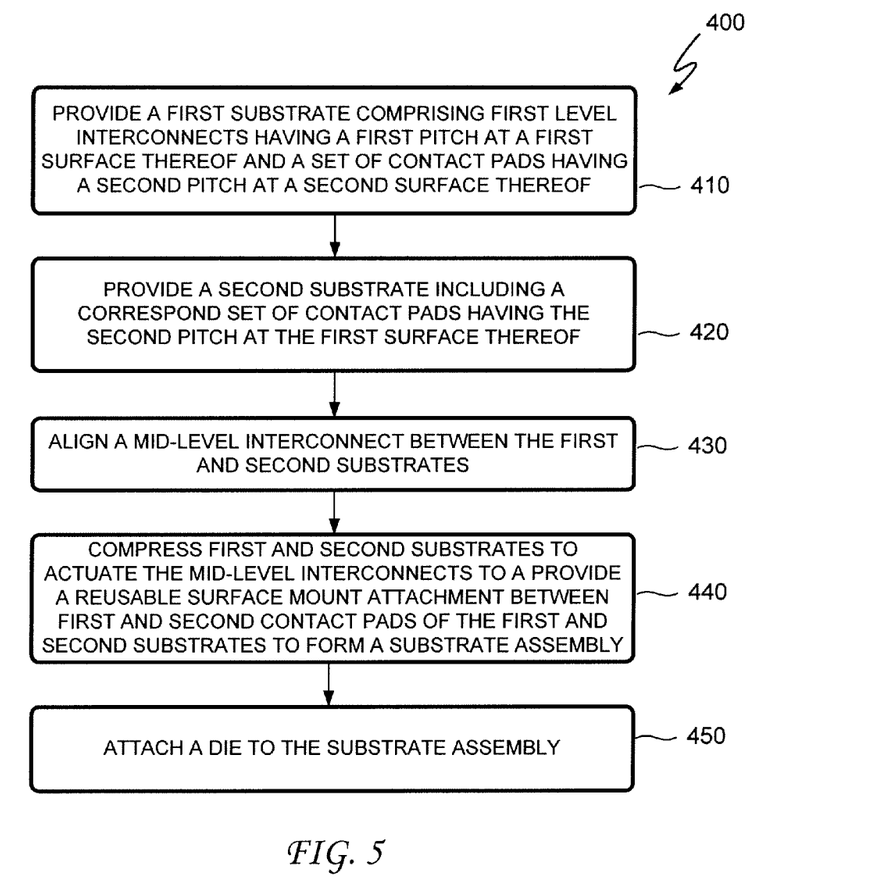
FIG. 5 is a flowchart illustrating a method of manufacturing a microelectronic package according to an embodiment of the invention.

FIG. 5 is a flowchart illustrating a method 400 of manufacturing a microelectronic package according to one embodiment. As an example, method 400 may result in the formation of a microelectronic package that is similar to microelectronic package 100 that is first shown in FIG. 1, not including die 110.

At process block 410 of method 400, a first substrate is provided. As an example, the first substrate can be similar to substrate 120 that is first shown in FIG. 1. Accordingly, in one embodiment, first substrate 120 has first surface area 125 and comprises first level interconnects 226 having first pitch 227 at first surface 121 thereof and a set of contact pads 228 having second pitch 229 at second surface 222 thereof, and first pitch 227 is smaller than second pitch 229.

At process block 420 of method 400, a second substrate is provided. In one embodiment, second substrate 130 has first and second internal electrically conductive layers (233, 234) that are connected to each other with microvia 240, as shown in FIG. 2. As an example, a substrate assembly can represent a combination of substrates that are similar to the first substrate and the second substrate. As another example, the microvia can be similar to microvia 240 that is shown in FIG. 2. As another example, the second substrate can be similar to substrate 130 that is first shown in FIG. 1. Accordingly, in one embodiment, the second substrate 130 has a surface area 135, is coupled to the first substrate using a compression-based interconnects 300, and comprises a third set of interconnects 236 having a third pitch 237. In this embodiment, second pitch 229 is smaller than third pitch 237, and surface area 115 is smaller than surface area 125, which is smaller than surface area 135.

Referring again to FIG. 5, at process block 430 a mid-level interconnect may be aligned between the first and second substrates. In one embodiment, the mid-level interconnect is, for example, a compression-based interconnect as shown with reference to FIGS. 1 and 2-4. In one embodiment, the alignment may be provided by a load housing mechanism as well as possible alignment posts. As process block 440, the first and second substrates may be compressed to actuate the mid-level interconnects to provide a reusable surface mount attachment between the first and second contact pads and the first and second substrates to form a substrate assembly.

Although described in process block 440 as indicating that the first and second substrates are simultaneously connected using the mid-level interconnect, the second substrate may be first coupled to, for example, a motherboard or other printed circuit board using standard flip chip or ball grid array assembly techniques. Likewise, the mid-level interconnect may be first coupled to the second substrate which may be an interposer 130, as shown in FIG. 2. Subsequently, the first substrate 120 may be removably coupled to the MLI opposite the second substrate 130. Finally, at process block 450, a die may be attached to the substrate assembly. Although indicated as the final process block of method 400, the die may be first attached to the first substrate which is, for example, an HDI patch as shown in FIG. 2.

Figure 6:
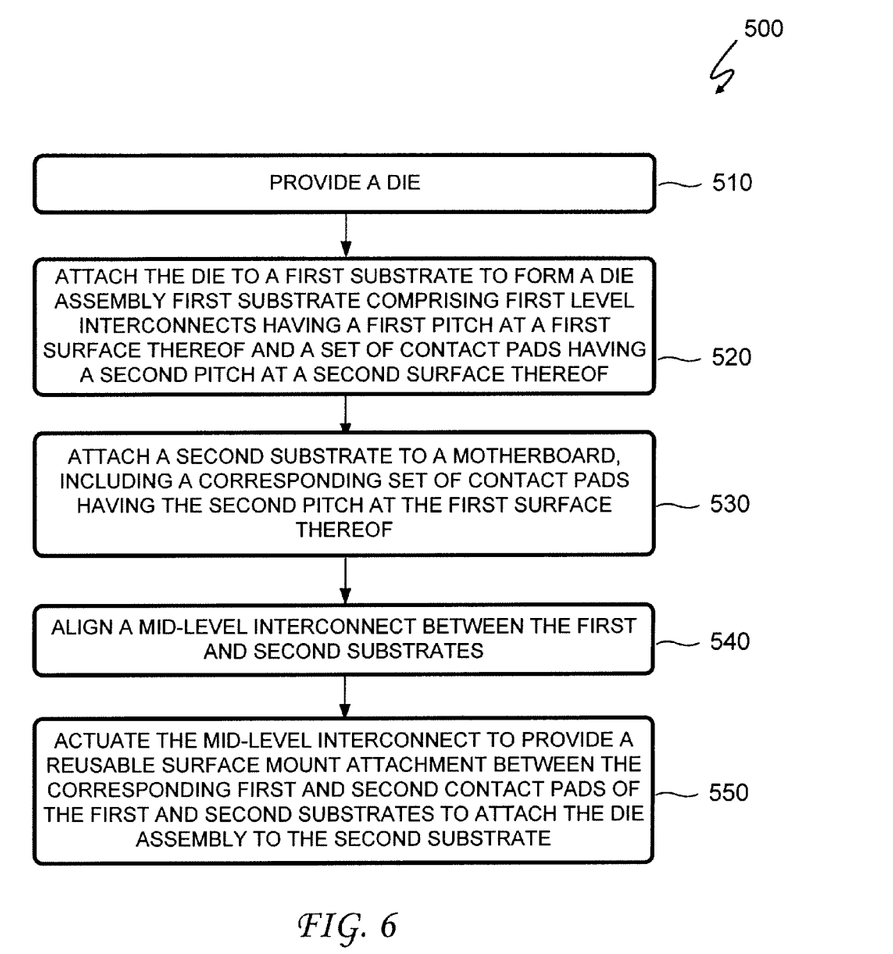
FIG. 6 is a flowchart illustrating a method of manufacturing a microelectronic package according to another embodiment of the invention.

FIG. 6 is a flowchart illustrating method 500 of manufacturing a microelectronic package according to an embodiment. As an example, method 500 may result in the formation of a microelectronic package that is similar to microelectronic package 100 that is first shown in FIG. 1, including die 110.

At process block 510 of method 500, the die is provided. As an example, the die can be similar to die 110 that is first shown in FIG. 1.

At process block 520 of method 500, the die is attached to a first substrate to form a die assembly. As an example, the first substrate can be similar to substrate 120 that is first shown in FIG. 1. Accordingly, in one embodiment, first substrate 120 has first surface area 125 and comprises first level interconnects 226 having first pitch 227 at first surface 121 thereof and a set of contact pads 228 having second pitch 229 at second surface 222 thereof, and first pitch 227 is smaller than second pitch 229. As another example, the die assembly can be similar to the combination of the die and the first substrate.

Referring again to FIG. 6, at process block 530 a second substrate may be attached to a motherboard using, for example, standard flip chip or BGA assembly techniques. For example, as shown in FIG. 2, second level interconnects (SLI) may be used to physically couple second substrate 130 to a motherboard or other printed circuit board. This may also be accomplished using a socket or other like component connection technique. As shown in FIG. 2, the second substrate 130 may include a set of contact pads 230 that correspond to contact pads 228 of first substrate 120 where the corresponding contact pads 230 have second pitch 229 and are located at first surface 131 of second substrate 130. At process block 540, a mid-level interconnect may be aligned between the first and second substrate. As indicated above, alignment may be provided using a load housing assembly mechanism as well as alignment posts. At process block 550, the mid-level interconnect may be actuated to provide a reusable surface mount attachment between the corresponding first and second contact pads of the first and second substrates to attach the die assembly to the second substrate.

As indicated above, the actuation of the mid-level interconnect is provided to cause opposing arms of the mid-level interconnect to engage a surface of the corresponding first and second contact pads of these first and second substrates. In one embodiment, the MLI may be in the form of double-compression pins that form an interface between components to provide a plug and play connection. A compression-based MLI enables reuse of any of the components to enable OEMs to mix and match generation to generation silicon to interposer, without having to throw away any components. In one embodiment, actuation of the MLI causes opposing arms of the interconnect to, for example, slide across the corresponding contact pads to provide a micro-connection between MLI arms and the corresponding contact pads. In one embodiment, the load is maintained with, for example, a load housing mechanism. Subsequently, when a next generation chip, CPU or other chipset functionality is available, the load mechanism may be disengaged to cause the contact pins of the MLI to disengage from the contact pads. A compression-based MLI enable removable of the die assembly for replacement with a next generation die assembly.

At process block 550 of method 500, the die assembly is attached to second substrate 130 having first and second internal electrically conductive layers (233, 234) that are connected to each other with microvia 240. As an example, the microvia can be similar to microvia 240 that is shown in FIG. 2. As an example, the second substrate can be similar to substrate 130 that is first shown in FIG. 1.

It was mentioned above that existing microelectronic packaging solutions employ HDI substrates to handle the space transformation from die bump pitch to system board level pitch. The cost structure of the HDI substrate is largely determined by the technology required to achieve the minimum—and more expensive to implement—design rules. These minimum design rules, however, are really only needed in the area under the die shadow and in the first few millimeters of signal routing from the die edge. In the existing approach, therefore, the cost is driven by the requirements of only about 20% of the total area of the substrate.

Although described with reference to specific embodiments, it will be understood by those skilled in the art that various changes may be made without departing from the spirit or scope of the embodiments. Accordingly, the disclosure of embodiments presented is intended to be illustrative of the inventive scope presented and is not intended to be limiting. It is intended that the scope presented shall be limited only to the extent required by the appended claims. For example, to one of ordinary skill in the art, it will be readily apparent that the microelectronic package and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of comprising:
providing a first substrate comprising first level interconnects having a first pitch at a first surface thereof and a set of first contact pads having a second pitch at a second surface thereof;
providing a second substrate comprising a first surface comprising a set of second contact pads having the second pitch;
aligning a mid-level interconnect between the first and second substrates;
compressing the first and second substrates to actuate opposing arms of the mid-level interconnect to engage each respective surface of the corresponding first and second contact pads of the first and second substrates to form a substrate assembly; and
attaching a die to the substrate assembly.

2. The method of claim 1 further comprising:
vertically aligning the set of contact pads of the first surface with the set of contact pads at the second surface of the first substrate, and
using opposing compression-based pins of the mid-level interconnects to activate a surface of the corresponding first and second contact pads of the first and second substrates to provide micro-connections therebetween.

3. The method of claim 1 which compressing further comprises:
aligning a first portion of the opposing arms of the mid-level interconnect with the corresponding contact pads of the second substrate; and
actuating the first portion of the opposing arms with a load to activate a surface of the corresponding contact pads of the second substrate to provide a reusable surface mount attachment between the second substrate and the mid-level interconnect.

4. The method of claim 3 further comprising:
aligning a second portion of the opposing arms of the mid-level interconnect with the corresponding contact pads of the first substrate; and
actuating a second portion of the opposing arms with a load to activate a surface of the corresponding contact pads of the second substrate to provide a reusable surface mount attachment between the first substrate and the mid-level interconnect.

5. The method of claim 1 wherein:
releasing a load on the mid-level interconnect to disengage the first substrate from the mid-level interconnect;
replacing the first substrate with a patch including an attached chipset; and
actuating opposing arms of the mid-level interconnect to engage a respective surface of the contact pads of the patch to form an upgraded substrate assembly.

6. The method of claim 1 wherein:
a surface area of the second surface of the first substrate is smaller than a surface area of the first surface of the second substrate.

7. The method of claim 1 wherein the mid-level interconnect comprises:
a housing comprising opposing arms according to the second pitch; and further comprising:
actuating the opposing arms to provide micro-connections with the corresponding first and second contact pads of the first and second substrates when actuated with a load.

8. The method of claim 7, wherein the opposing arms comprise flange-shaped pins.

9. The method of claim 1 wherein the housing comprises:
one or more through-hole posts to provide a load to compress and actuate a double compression mid-level interconnect.

10. The method of claim 1, further comprising:
coupling first level interconnects having the first pitch at a first surface of the microelectronic die to the first level interconnects of the first surface of the first substrate; and
coupling first level interconnects having the third pitch at a first surface of the motherboard to the second level interconnects at the second surface of the second substrate.

11. A method of comprising:
providing a first substrate comprising first level interconnects having a first pitch at a first surface thereof and a set of first contact pads having a second pitch at a second surface thereof;
providing a second substrate comprising a first surface comprising a set of second contact pads having the second pitch;
aligning a mid-level interconnect between the first and second substrates;
compressing the first and second substrates to actuate opposing arms of the mid-level interconnect to engage each respective surface of the corresponding first and second contact pads of the first and second substrates to form a substrate assembly; and
coupling a die to the first substrate using the first level interconnects.

12. The method of claim 11 further comprising:
vertically aligning the set of contact pads of the first surface with the set of contact pads at the second surface of the first substrate, and
using opposing compression-based pins of the mid-level interconnects to activate a surface of the corresponding first and second contact pads of the first and second substrates to provide micro-connections therebetween.

13. The method of claim 11 which compressing further comprises:
aligning a first portion of the opposing arms of the mid-level interconnect with the corresponding contact pads of the second substrate; and
actuating the first portion of the opposing arms with a load to activate a surface of the corresponding contact pads of the second substrate to provide a reusable surface mount attachment between the second substrate and the mid-level interconnect.

14. The method of claim 13 further comprising:
aligning a second portion of the opposing arms of the mid-level interconnect with the corresponding contact pads of the first substrate; and
actuating a second portion of the opposing arms with a load to activate a surface of the corresponding contact pads of the second substrate to provide a reusable surface mount attachment between the first substrate and the mid-level interconnect.

15. The method of claim 11 wherein:
  releasing a load on the mid-level interconnect to disengage the first substrate from the mid-level interconnect;
  replacing the first substrate with a patch including an attached chipset; and
  actuating opposing arms of the mid-level interconnect to engage a respective surface of the contact pads of the patch to form an upgraded substrate assembly.

16. The method of claim 11 wherein:
  the first pitch is smaller than the second pitch, the second pitch is smaller than the third pitch, and
  a surface area of the first substrate is smaller than surface area of the second substrate.

17. The method of claim 11 wherein:
  the first substrate is a high density interconnect patch.

18. The method of claim 11 wherein:
  the first substrate comprises a core having a thickness that is no greater than 37 micrometers.

19. The microelectronic package of claim 11 wherein the double-compression interconnect comprises:
  one or more through-hole posts to provide a load to compress and actuate a double compression mid-level interconnect.

20. The method of claim 11, further comprising:
  coupling first level interconnects having the first pitch at a first surface of the microelectronic die to the first level interconnects of the first surface of the first substrate; and
  coupling first level interconnects having the third pitch at a first surface of the motherboard to the second level interconnects at the second surface of the second substrate.

* * * * *